United States Patent
Yonaga et al.

(10) Patent No.: US 7,114,113 B2
(45) Date of Patent: Sep. 26, 2006

(54) TEST CIRCUIT PROVIDED WITH BUILT-IN SELF TEST FUNCTION

(75) Inventors: Takeru Yonaga, Tokyo (JP); Hiroyuki Fukuyama, Yamanashi (JP); Hitoshi Tanaka, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 455 days.

(21) Appl. No.: 10/647,378

(22) Filed: Aug. 26, 2003

(65) Prior Publication Data
US 2004/0044491 A1 Mar. 4, 2004

(30) Foreign Application Priority Data
Aug. 30, 2002 (JP) .............................. 2002-256193

(51) Int. Cl.
*G06F 11/00* (2006.01)
(52) U.S. Cl. ........................................ 714/744; 714/735
(58) Field of Classification Search ................... None
See application file for complete search history.

(56) References Cited

U.S. PATENT DOCUMENTS 5,640,401 A * 6/1997 Yamada ..................... 714/716
6,009,028 A * 12/1999 Akiyama .................... 365/201
6,343,366 B1 * 1/2002 Okitaka ...................... 714/733
6,744,272 B1 * 6/2004 Ernst et al. .................. 324/765

FOREIGN PATENT DOCUMENTS

| JP | 10-199294 | 7/1998 |
| JP | 2002-174662 | 6/2002 |

* cited by examiner

*Primary Examiner*—Christine T. Tu
(74) *Attorney, Agent, or Firm*—VolentineFrancos& Whitt,PLLC (57) ABSTRACT

A test circuit includes an input circuit for inputting data to select a test mode relative to a circuit to be tested and outputting result of selection of the test mode in synchronization with a first clock, a pattern generation circuit for responding to result of selection of the test mode, generating a test pattern in synchronization with a second clock and outputting the test pattern to the circuit to be tested and a comparator circuit for inputting result of test of the circuit to be tested in synchronization with the second clock, and comparing coincidence/non-coincidence between the result of the test and the test pattern supplied to the circuit to be tested. The test circuit further includes an output circuit for holding result of comparison by the comparator circuit and outputting the result of comparison in synchronization with the first clock.

5 Claims, 9 Drawing Sheets

TEST CIRCUIT PROVIDED WITH BUILT-IN SELF TEST FUNCTION

BACKGROUND OF THE INVENTION

The invention relates to a test circuit such as a built-in self test (hereinafter referred to as BIST) circuit and the like provided with two group of clocks which are different in frequency for testing a circuit to be tested such as a high-speed semiconductor memory and the like, and a semiconductor integrated circuit such as a control chip, a system large scaled integrated circuit (hereinafter referred to as system LSI) and the like, in which the test circuit is built in, and a method of testing the same.

A technology relating to a conventional BIST serving as one of test circuits for testing a semiconductor integrated circuit and the like has been disclosed in JP-A H10-199294, JP-A 2002-174662.

The BIST circuit is a circuit for generating commands of a circuit to be tested (e.g., Synchronous Dynamic Random Access Memory serving as one of semiconductor memories, hereinafter referred to as "SDRAM"), and it is used, for example, when connected to a tester.

The BIST circuit has a BIST control circuit, and a pattern generation circuit and a data comparator are connected to an output of the BIST control circuit, respectively. An output control circuit is connected to an output of the data comparator. These BIST control circuit, pattern generation circuit, data comparator, and output control circuit are formed on the same semiconductor substrate, respectively.

A test clock outputted from the tester has, e.g., about 40 MHz, and all the circuit blocks inside the BIST circuit operate in synchronization with the test clock, respectively. A clock outputted from the pattern generation circuit is synchronous with the test clock, and has a frequency which is not more than that of the test clock, and the SDRAM is tested in response to this clock.

For example, in cases where an SDRAM to be tested for use in high-speed operation and has an actual operating frequency not less 100 MHz which is faster than the frequency of the test clock, the high-speed SDRAM can not be tested with an actual operating frequency using a low speed tester.

That is, in cases where the high-speed SDRAM is intended to be tested by the conventional BISI circuit with the actual operating frequency exceeding the test clock, the SDRAM can not be tested so far.

Accordingly, when a high-speed SDRAM is to be tested, a high-speed tester capable of generating a high-speed test clock corresponding thereto, and of processing a high-speed test data output signal is needed. However, the speeding up of the semiconductor integrated circuit such as an SDRAM and the like has recently made rapid progress, and hence if a tester is prepared in accordance therewith, cost of equipment has increased and also training for making full use of the tester is needed, resulting in disadvantage and inconvenience.

SUMMARY OF THE INVENTION

The invention may provide a test circuit comprising an input circuit for inputting data to select a test mode relative to a circuit to be tested and outputting result of selection of the test mode in synchronization with a first clock, a pattern generation circuit for responding to result of selection of the test mode, generating a test pattern in synchronization with a second clock and outputting the test pattern to the circuit to be tested, a comparator circuit for inputting result of test of the circuit to be tested in synchronization with the second clock, and comparing coincidence/non-coincidence between the result of the test and the test pattern supplied to the circuit to be tested, and an output circuit for holding result of comparison by the comparator circuit and outputting the result of comparison in synchronization with the first clock.

PREFERRED EMBODIMENT OF THE INVENTION

Figure 1:
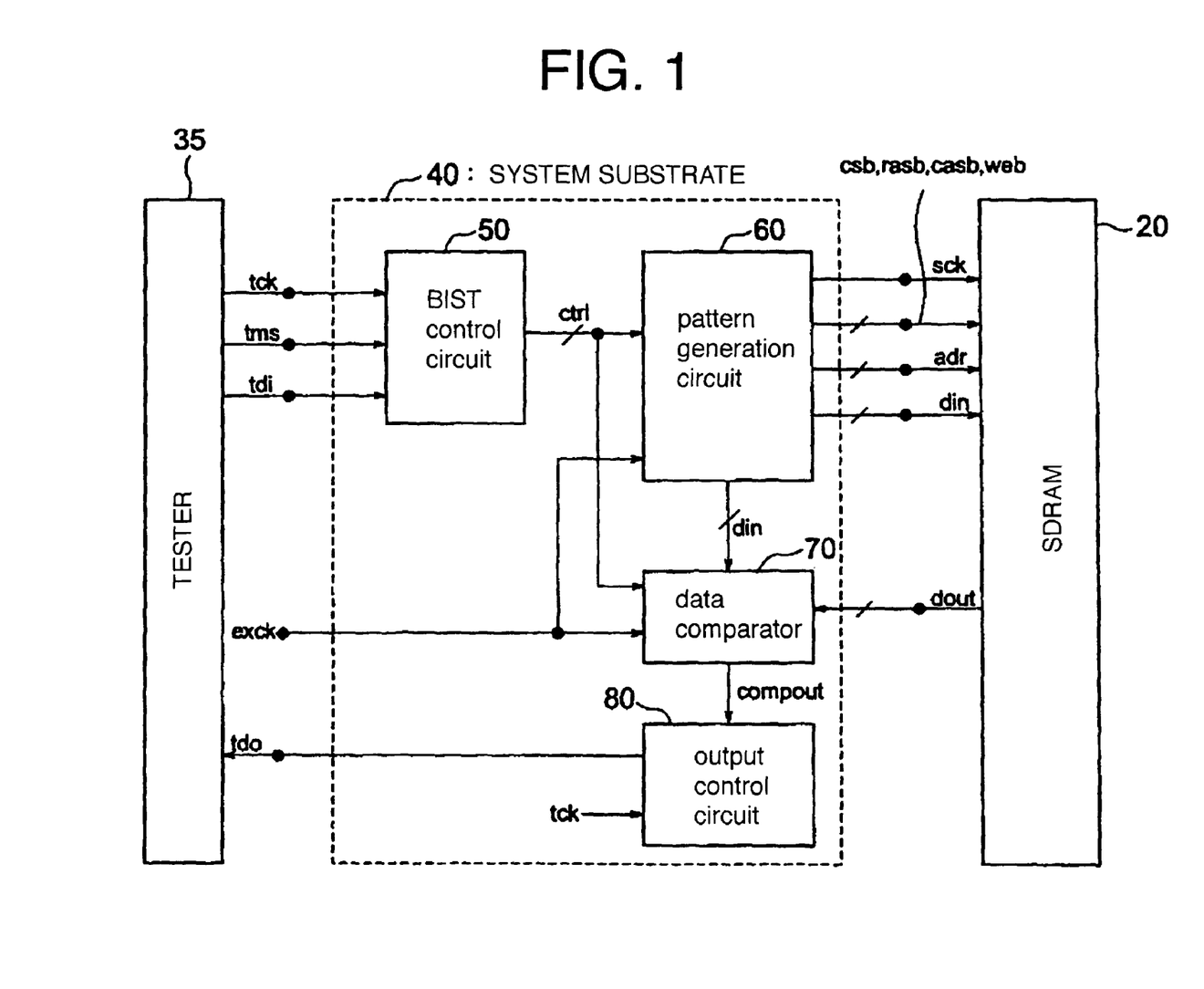
FIG. 1 is a circuit diagram showing a BIST circuit according to a first embodiment of the invention.

FIG. 1 is schematic circuit diagram showing a structure of a circuit (e.g., a BIST circuit) according to a first embodiment of the invention.

A BIST circuit 40 is a circuit for testing a circuit to be tested (e.g., an SDRAM 20 serving as a semiconductor memory) using a conventional tester 35 and has input means (e.g., a BIST control circuit 50), pattern generation means (e.g., pattern generation circuit 60) and comparator means (e.g., data comparator 70) which are connected to an output of input means, respectively. Further, output means (e.g., output control circuit 80) is connected to an output of the data comparator 70. These BIST control circuit 50, pattern generation circuit 60, data comparator 70 and output control circuit 80 are formed, e.g., on the same semiconductor substrate.

The BIST control circuit 50 inputs data for selecting a test mode relative to the SDRAM 20 (data for a standard serial interface in compliance with a JTAG standard, e.g., a test clock tck serving as a first clock having about 40 MHz, a test mode signal tms, and a test data input signal tdi supplied from the tester 35, respectively) and outputs the result of selection of the test mode (e.g. BIST control signal ctr1) to the pattern generation circuit 60 in synchronization with the test clock tck.

The pattern generation circuit 60 inputs the BIST control signal ctr1, a second clock which is supplied from an outside (e.g., an external clock exck having not less than 100 MHz) and generates test patterns (e.g., a clock sck, serving as an input signal of the SDRAM 20, commands csb, rasb, casb, web, an address adr, and an input data din) in response to the BIST control signal ctr1, and outputs the test patterns to the SDRAM 20 and outputs the input data din to the data comparator 70 as an expected value.

The data comparator 70 inputs an output data dout which is result of the test of the SDRAM 20 in synchronization with the external clock exck, and also inputs the BIST control signal ctr1 and a test pattern (e.g., the input data din serving as an expected value) supplied to the SDRAM 20, and compares coincidence/non-coincidence between the input data din and output data dout, and outputs the result of comparison compout to the output control circuit 80.

The output control circuit 80 inputs and holds the result of comparison compout and outputs a test data output signal tdo corresponding to the result of comparison compout to the tester 35 in synchronization with the inputted test clock tck.

Figure 2:
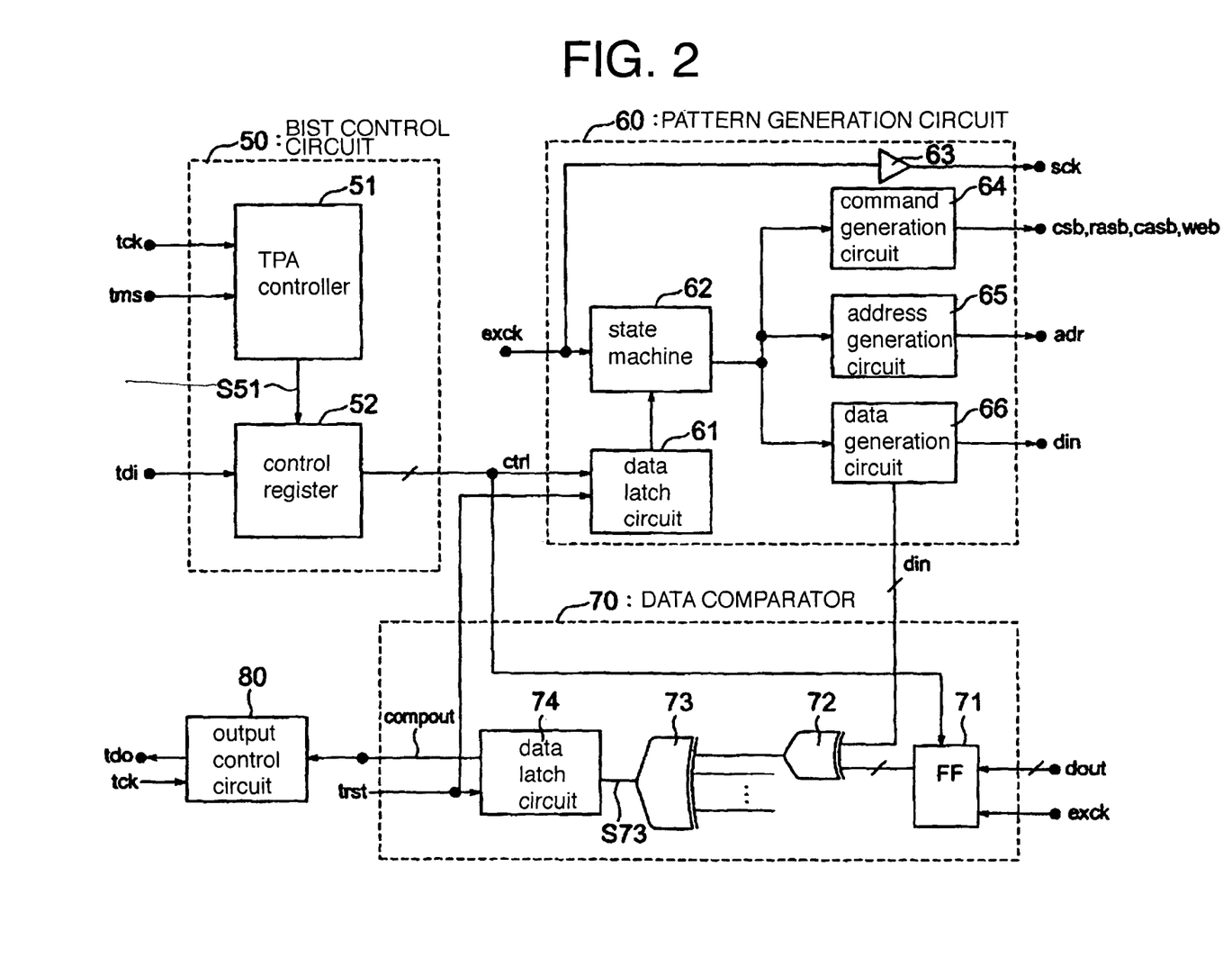
FIG. 2 is a circuit diagram showing the structure of an internal circuit of the BIST circuit in FIG. 1.

FIG. 2 is a schematic circuit diagram showing the internal structure of the BIST circuit 40 shown in FIG. 1.

The BIST control circuit 50 has a test access port (Test Acctess Port, hereinafter referred to simply as "TPA") controller 51, and a control register 52 is connected to an output of the TPA controller 51. The TPA controller 51 is a circuit for inputting the serial test clock tck and the test mode signal tms, and outputting a register control signal s51 to the control register 52. The control register 52 fetches the serial test data input signal tdi in response to the register control signal s51, converts the fetched serial test data input signal tdi to a parallel signal, and outputs the BIST control signal ctr1 of a logic "H" seving as a starting signal to the pattern generation circuit 60 and data comparator 70.

The pattern generation circuit 60 has a data latch circuit 61 for inputting the BIST control signal ctr1 and a reset signal trst which is supplied from the tester 35 and the like and a state machine 62 is connected to an output of the data latch circuit 61. A buffer 63 is connected to an output of the state machine 62, and a command generation circuit 64, an address generation circuit 65, and a data generation circuit 66 are connected to an output side of the state machine 62, respectively.

The data latch circuit 61 is a circuit for latching and holding the BIST control signal ctr1 supplied from the control register 52 when the BIST control signal ctr1 becomes "H", and canceling the latching when the reset signal trst is inputted. The state machine 62 connected to the output of the data latch circuit 61 operates when it receives "H" from the data latch circuit 61, generates plural kinds of states in synchronization with inputted the external clock exck and outputs a control signal for controlling the command generation circuit 64, address generation circuit 65, and data generation circuit 66. The buffer 63 connected to the input of the state machine 62 is a circuit for driving the external clock exck to supply the clock sck to the SDRAM 20.

The commands csb, rasb, casb, web are generated in the command generation circuit 64 by the control of the state machine 62 and the address adr is generated in the address generation circuit 65 while the input data din is generated in the data generation circuit 66 wherein the commands csb, rasb, casb, web and the like are supplied to the SDRAM 20.

The data comparator 70 has a flip-flop (hereinafter referred to as FF) 71 which operates in response to the BIST control signal ctr1 and fetches the output data dout of the SDRAM 20 in synchronization with the external clock exck. An exclusive-OR gate (hereinafter referred to as EXOR) 72 having two inputs for data comparator, an EXOR 73 having multiple inputs for use in data comparison, and a data latch circuit 74 for holding data are connected to an output of the FF 71, serially respectively.

The EXOR 72 is a circuit for comparing the output data of the SDRAM 20 fetched by the FF 71 with the input data din of the expected value supplied from the data generation circuit 66, and becomes "H" when both the inputs are not coincident with each other, and it becomes "L" when both the inputs are coincident with each other. The EXOR 73 connected to an output of the EXOR 72 is a circuit for comparing an output signal of the FF 71 and another signal and outputting result of comparison s73, and the data latch circuit 74 is connected to an output of the EXOR 73. The data latch circuit 74 is a circuit for latching and holding "H" of the result of comparison s73 outputted from the EXOR 73 and outputting result of comparison compout of "H" to the output control circuit 80, and the latch state of the EXOR 73 is cancelled by the reset signal trst. "H" of the result of comparison compout is latched by the output control circuit 80, and the serial test data output signal tdo corresponding to the content of the latch is outputted to the a tester 85 in synchronization with the test clock tck.

Both the data latch circuits 61 and 74 are structured, for example, by the same circuit.

Figure 3:
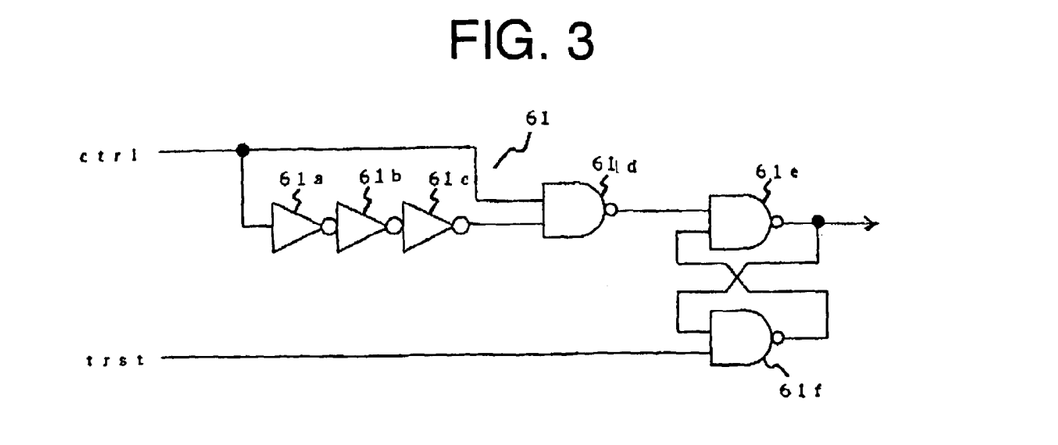
FIG. 3 is a circuit diagram showing a data latch circuit in FIG. 2.

FIG. 3 is a circuit diagram showing the structure of the data latch circuit 61 in FIG. 2.

According to the data latch circuit 61, the BIST control signal ctr1 to be inputted to the data latch circuit 61 is delayed by three staged inverters 61*a*, 61*b*, 61*c*, and NAND is determined based on a NAND gate 61*d* based on the result of delay and the BIST control signal ctr1, and. Result of logic is held by an FF comprising two NAND gates 61*e*, 61*f* which are connected to each other in cross.

Figure 4:
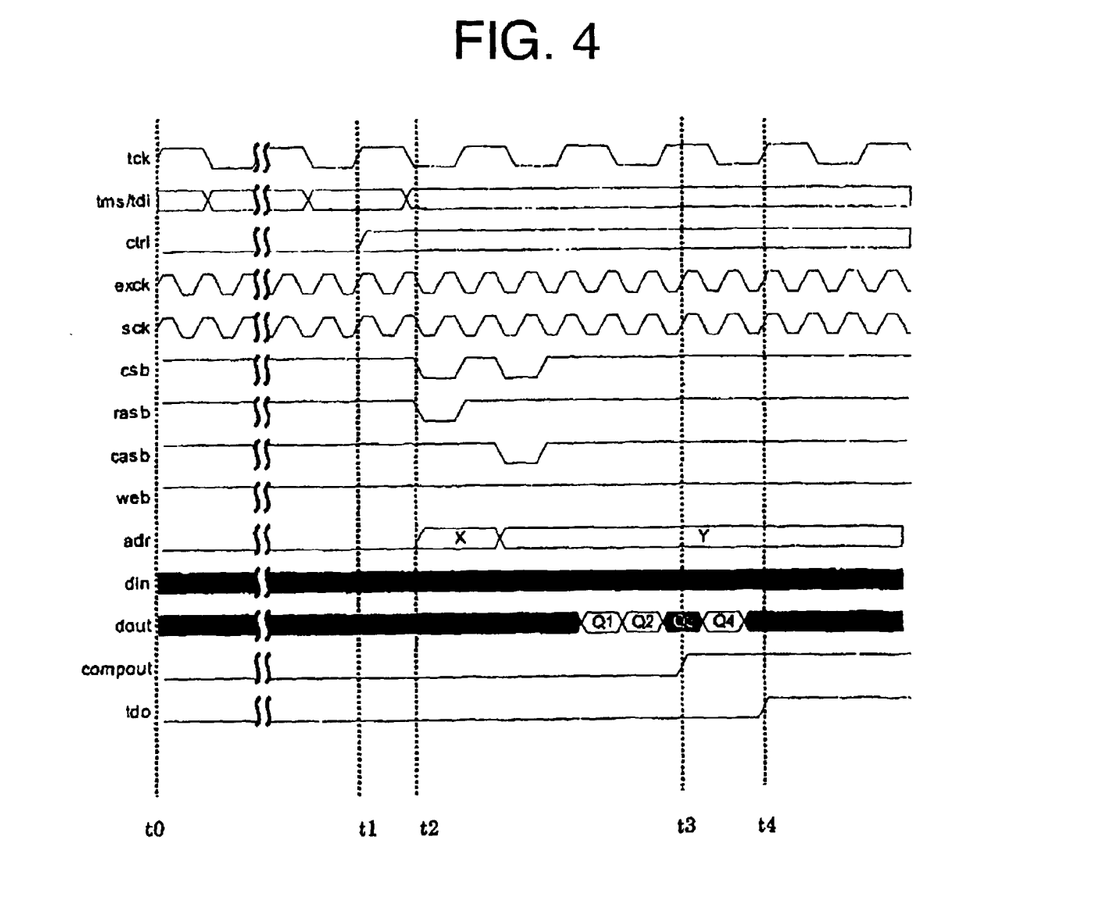
FIG. 4 shows a waveform chart showing waveforms outputted from the BIST circuit in FIG. 1 when it operates.

FIG. 4 shows a waveform chart showing waveforms representing an example of testing method of the SDRAM 20 using the BIST circuit 40 in FIG. 1. According to this waveform chart, an example of read operation of the SDRAM 20 is illustrated.

A write operation for testing the SDRAM 20 is first briefly described.

The serial test clock tck, test mode signal tms and test data input signal tdi are outputted from the tester 35 and supplied to the BIST circuit 40 while the external clock exck is supplied from the outside to the BIST circuit 40. As a result, the BIST control signal ctr1 is outputted from the BIST control circuit 50 in synchronization with the test clock tck in the BIST circuit 40.

The pattern generation circuit 60 operates while the BIST control signal ctr1 is triggered, and the clock sck, commands csb, rasb, casb, web, the address adr, and the input data din are generated in synchronization with the external clock exck, and these signals are supplied to the SDRAM 20. The thus input data din is sequentially written in memory cells in memory cell arrays 31-1, 31-2.

The read operation of the SDRAM 20 is now described with reference to FIG. 4.

In cases where the test clock tck, test mode signal tms and test data input signal tdi are supplied from the tester 35 to the BIST circuit 40 at time t0 in FIG. 4, data for deciding a test mode such as a test pattern, a method of scanning an address and the like in response to the test mode signal tms and the test data input signal tdi is inputted to the BIST control circuit 50. The external clock exck which is supplied from the outside is driven by the buffer 63 inside the pattern generation circuit 60 and the clock sck which is synchronous with the external clock exck is outputted and supplied to the SDRAM 20.

In the BIST control circuit 50, at time t1, the test mode is selected by the TPA controller 51, and "H" of the BIST control signal ctr1 corresponding to the result of selection is outputted from the control register 52 in synchronization with the test clock tck, and is outputted to the pattern generation circuit 60 and data comparator 70.

In the pattern generation circuit 60, at time t2, "H" of the BIST control signal ctrl is latched and held by the data latch circuit 61, and the state machine 62 operates in synchronization with the external clock exck. The commands csb, rasb, casb, web are generated in the command generation circuit 64 in synchronization with the external clock exck by the control of the state machine 62, and the address adr is generated in the address generation circuit 65, and these commands csb, rasb, casb, web and the address adr are supplied to the SDRAM 20. Further, the input data din is generated in the data generation circuit 66 and it is supplied to the SDRAM 20 and data comparator 70.

In the SDRAM 20, at time t2, when the control signal csb becomes "L" and the control signal rsb becomes "L", then the control signal casb becomes "L", data Q1, Q2, Q3, . . . for testing which are written in the memory cell arrays 31-1, 31-2, are successively read out and the output data dout is supplied to the data comparator 70.

In the data comparator 70, the FF 71 operates in response to the BIST control signal ctrl, and the output data dout is fetched in the data comparator 70 in synchronization with the external clock exck. The fetched output data dout is compared with the expected value of input data din by the EXORs 72, 73. The result of comparison s73 of the EXOR 73 becomes "L" when the output data dout and the expected value of the input data din coincide with each other, while it becomes "H" when the output data dout and the expected value of the input data din do not coincide with each other.

For example, at time t3, if the Q3 of the output data dout of the SDRAM 20 is defective, the result of comparison s73 generated in synchronization with the external clock exck becomes "H", and this "H" is latched and held by the data latch circuit 74. Accordingly, the result of comparison compout outputted from the data latch circuit 74 keeps "H" from time t3 on.

In the output control circuit 80, at time t4, it latches "H" of the result of comparison compout in synchronization with the test clock tck, and holds the test data output signal tdo of "H" from time t4 on, and outputs the same test data output signal tdo to the tester 35. The tester 35 can effect pass/fail decision of the SDRAM 20 in response to the test data output signal tdo.

The BIST circuit 40 in FIG. 1 operates in synchronization with the test clock tck during a period from time t0 to time t1 and a period after time t4, and it operates in synchronization with the external clock exck during a period from time t1 to time t4.

The first embodiment has the following effects.

Since the external clock exck which is not synchronous with the test clock tck is supplied to the BIST circuit 40, and the external clock exck is supplied through the buffer 63 inside the pattern generation circuit 60 while the clock sck which is actual operating frequency of the memory to be tested is supplied to the SDRAM 20, the actual operating frequency test which has been conventionally impossible can be easily achieved.

When the BIST control signal ctrl which is outputted from the BIST control circuit 50 becomes "H", this "H" can be latched and held by the data latch circuit 61 inside the pattern generation circuit 60. Likewise, in the data comparator 70, if the result of comparison s73 of the EXOR 73 becomes "H" representing defective condition, this "H" can be latched and held by the data latch circuit 74. Accordingly, data transmission and reception between two groups of asynchronous clocks between the test clock tck and the external clock exck can be effected by simple data latch circuits 61, 74 without requiring a complex circuit. Accordingly, the external clock exck can be set at an arbitrary frequency without any limitation.

Figure 5:
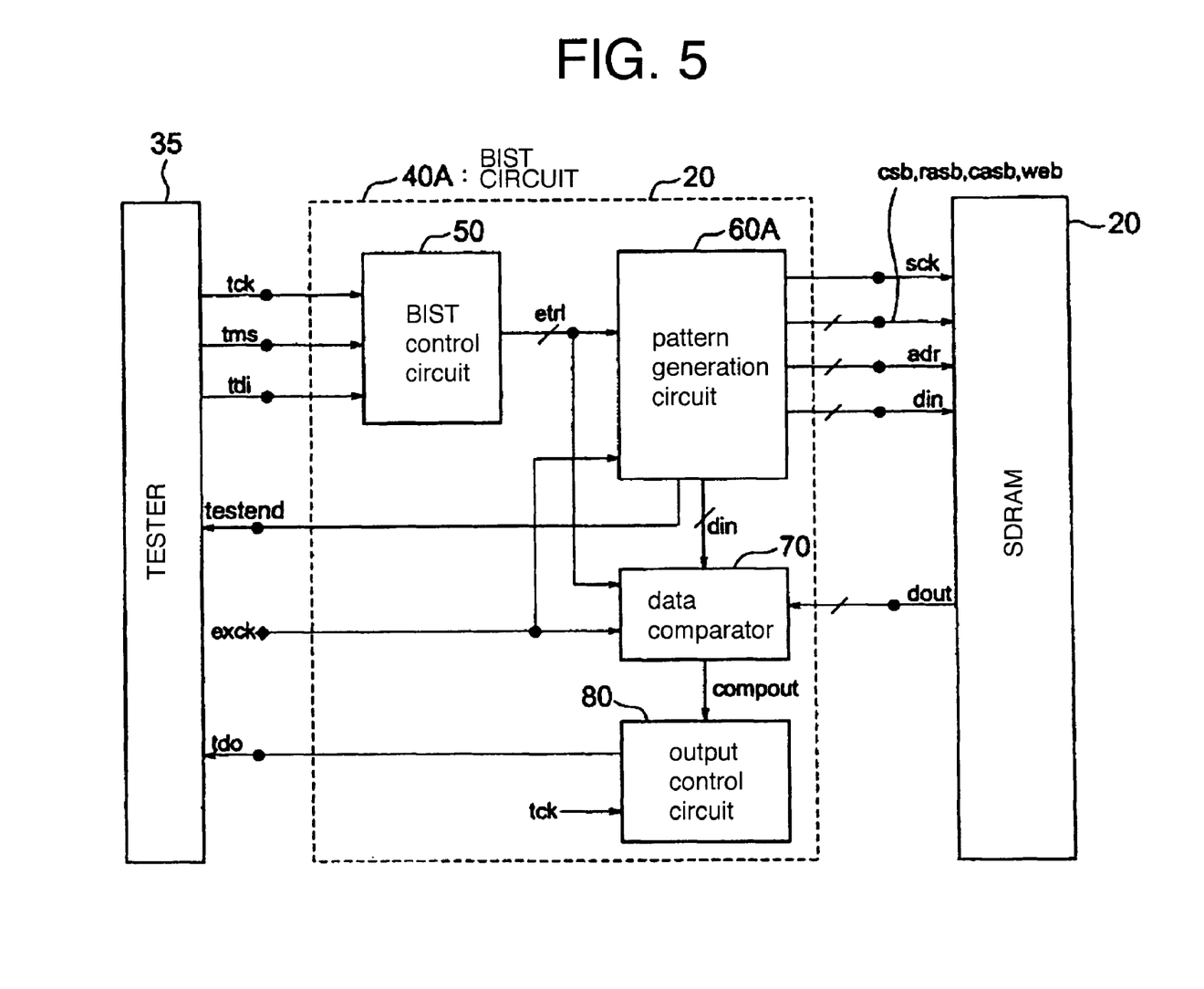
FIG. 5 is a circuit diagram showing a BIST circuit according to a second embodiment of the invention.
Figure 6:
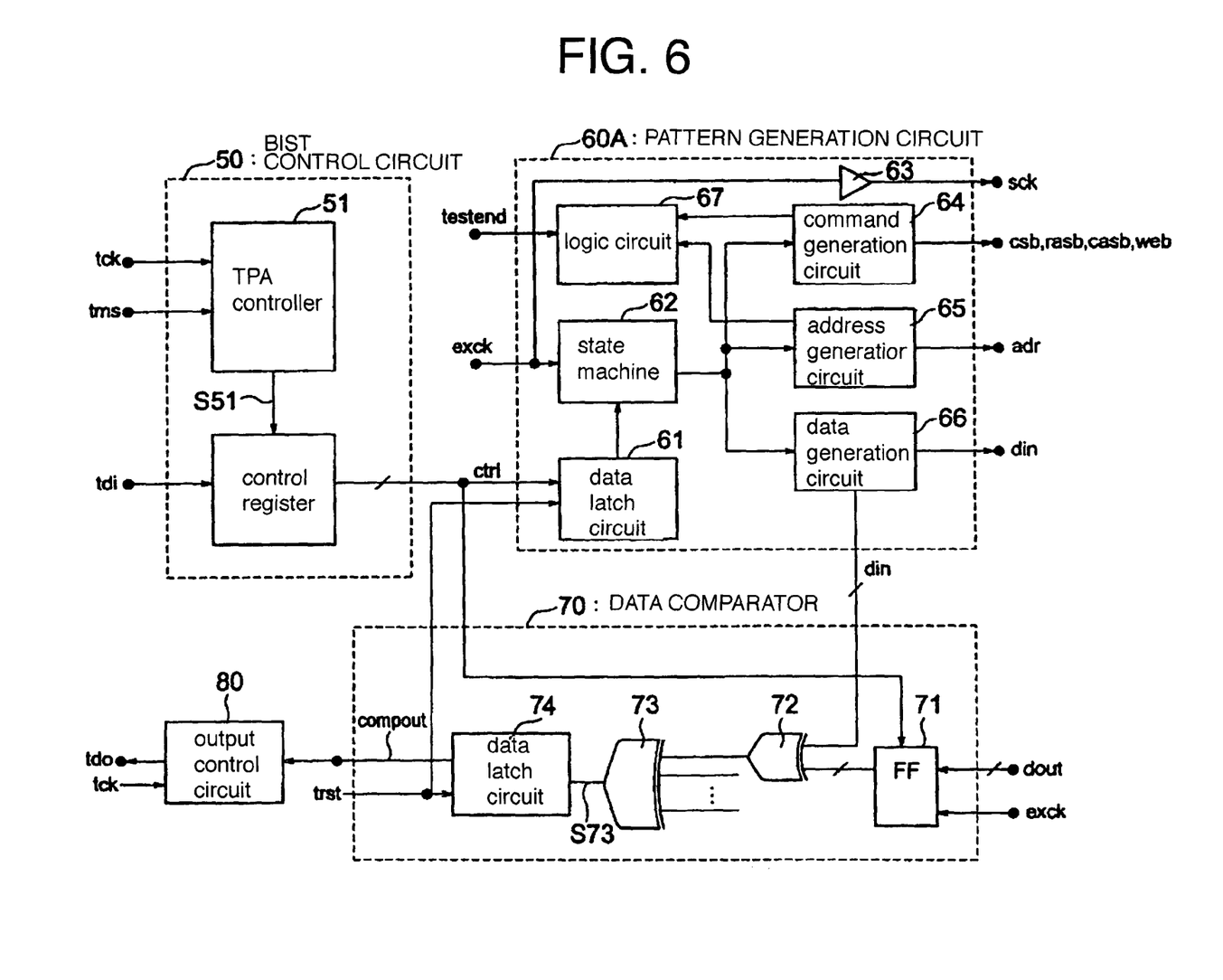
FIG. 6 is a circuit diagram showing the structure of an internal circuit of the BIST circuit in FIG. 5.

FIG. 5 is a schematic circuit diagram showing a test circuit (e.g., a BIST circuit) according to a second embodiment of the invention, and FIG. 6 is a schematic circuit diagram showing the structure of an internal circuit of the BIST circuit in FIG. 5. In FIG. 5 and FIG. 6, components which are common to those shown in FIG. 1 and FIG. 2 of the first embodiment are depicted by the common reference numerals.

A BIST circuit 40A is different from the BIST circuit 40 of the first embodiment in respect of the provision of a pattern generation circuit 60A capable of outputting a test pattern end signal testend instead of the pattern generation circuit 60 in the first embodiment.

As shown in FIG. 6, the pattern generation circuit 60A of the second embodiment is structured to have a circuit for outputting the test pattern end signal testend (e.g., a logic circuit 67) is newly provided in the pattern generation circuit 60 shown in FIG. 2. The logic circuit 67 detects the end of a test pattern while executing logical operation between an output of the command generation circuit 64 and an output of an address generation circuit 65, and outputs the test pattern end signal testend to an external tester 35 and the like.

Other configurations of the second embodiment are the same as those of the first embodiment.

Figure 7:
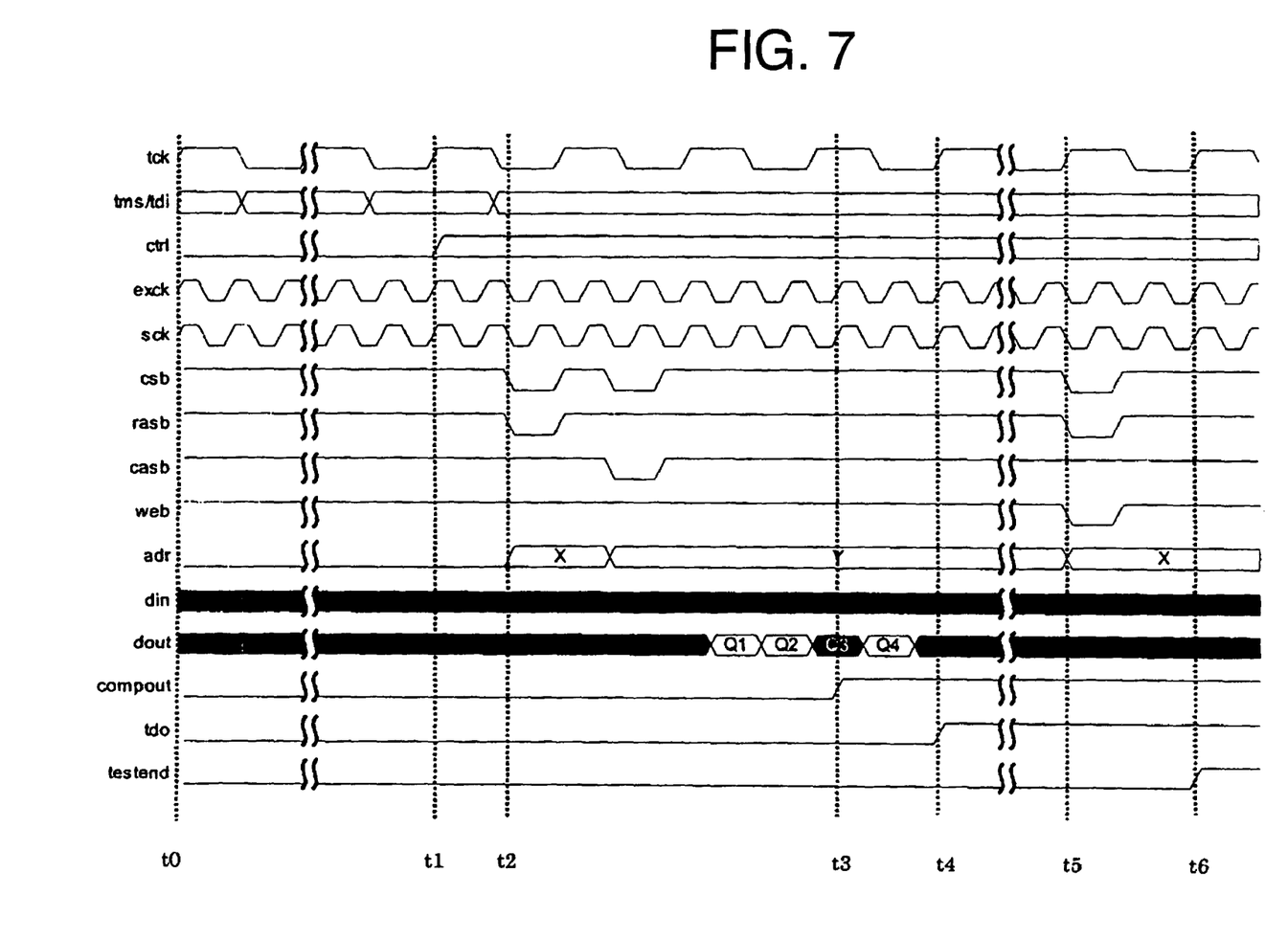
FIG. 7 shows a waveform chart showing waveforms outputted from the BIST circuit in FIG. 5 when it operates.

FIG. 7 shows a waveform chart showing waveforms representing an example of testing the SDRAM 20 using the BIST circuit 40A in FIG. 5. According to this waveform chart, an example of reading operation of the SDRAM 20 is illustrated in the same way as FIG. 4 showing waveforms of the first embodiment.

Test date is first written in the SDRAM 20 in the same way as the first embodiment.

Then, as shown in FIG. 7, the SDRAM 20 effects the reading of the test data. The same operation as that shown in FIG. 4 is effected during a period from time t0 to time t4.

That is, the tester 35 supplies the test clock tck, test mode signal tms and test data input signal tdi to the BIST circuit 40A at time t0. The external clock exck which is supplied from the outside is driven by a buffer 63 inside the pattern generation circuit 60 and the clock sck which is synchronous with the external clock exck is outputted and supplied to the SDRAM 20.

At time t1, "H" of the BIST control signal ctrl is outputted from the control register 52 in synchronization with the test clock tck, and is outputted to the pattern generation circuit 60 and data comparator 70.

At time t2, in the pattern generation circuit 60, "H" of the BIST control signal ctrl is latched and held by the data latch circuit 61 while commands csb, rasb, casb, web are generated in the command generation circuit 64 in synchronization with the external clock exck by the control of the state machine 62, and an address adr is generated in the address generation circuit 65, and these commands csb, rasb, casb, web and the address adr are supplied to the SDRAM 20. Further, an input data din is generated in a data generation circuit 66 and it is supplied to the SDRAM 20 and data comparator 70. Then, data Q1, Q2, Q3, . . . for testing which are written in the SDRAM 20 are sequentially read out and the output data dout is supplied to the data comparator 70.

The output data dout is compared with the expected value of the input data din by the EXORs 72, 73 in the data comparator 70. For example, at time t3, if the Q3 of the output data dout of the SDRAM 20 is defective, the result of comparison s73 becomes "H", and this "H" is latched and held by the data latch circuit 74.

At time t4, the result of comparison compout of "H" is latched by the output control circuit 80 in synchronization with the test clock tck, and the test data output signal tdo of "H" is outputted.

At time t5, the final commands csb, rasb, casb, web, and the address adr are generated by both the command generation circuit 64 and address generation circuit 65 in the pattern generation circuit 60A, and these commands csb, rasb, casb, web and address are supplied to the logic circuit 67 and also to the SDRAM 20. As a result, a precharge of the SDRAM 20 is effected, and then a process of end of reading is effected such that the activated word line of "H" is lowered to "L" and the like.

Subsequently at time 6, the test pattern end signal testend representing the end of test pattern is generated in the logic circuit 67, and it is outputted to the tester 35.

The second embodiment has the following effect in addition to the same effect as the first embodiment.

Since the logic circuit 67 for outputting the test pattern end signal testend in the pattern generation circuit 60A, it is possible to monitor (detect) the end of the interior operation of the BIST circuit which has been impossible so far by outputting the test pattern end signal testend outside the BIST circuit 40A. As a result, a test program can be easily prepared in the tester 35.

Figure 8:
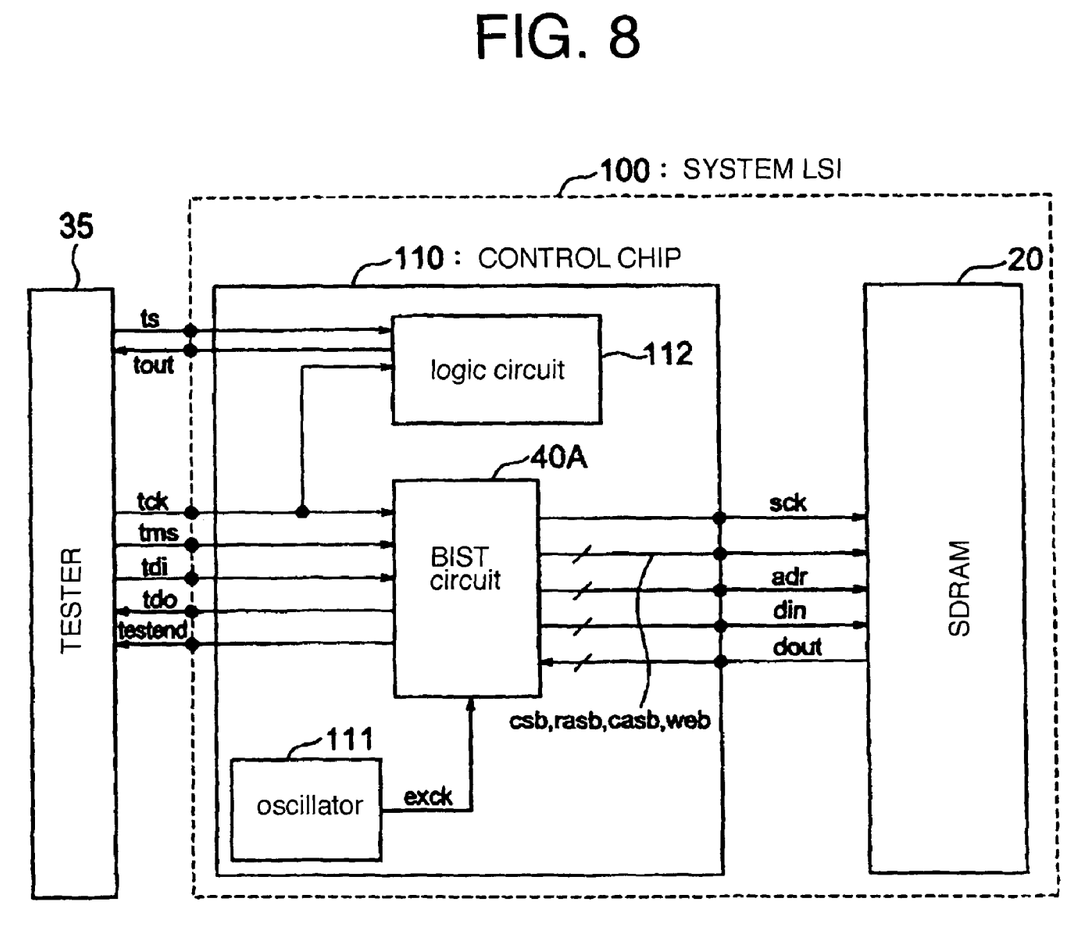
FIG. 8 is a circuit diagram showing the structure of a system LSI according to a third embodiment of the invention.

FIG. 8 is a schematic circuit diagram showing an example of the structure of a semiconductor integrated circuit (e.g., system LSI) showing a third embodiment on which the BIST circuit 40A of the second embodiment shown in FIG. 5 is mounted.

A system LSI 100 comprises a control chip 110 and the SDRAM 20 shown in FIG. 5 which are housed in the same package. The control chip 110 comprises the BIST circuit 40A shown in FIG. 5, clock generator means (e.g., oscillator (oscillator circuit) 111) for generating an external clock exck, and a logic circuit 112 which are formed on the same semiconductor substrate, respectively.

The BIST circuit 40A is a circuit for inputting a test clock tck, a test mode signal tms, a test data input signal tdi, an external clock exck and an output data dout of the SDRAM 20, and outputting a test data output signal tdo, a test pattern end signal testend and input signals (a clock sck, commands csb, rasb, casb, web, an address adr and an input data din) of the SDRAM 20. The logic circuit 112 is a circuit for inputting the test clock tck and a test signal ts, and outputting result of test tout to the tester 35. The SDRAM 20 is a semiconductor memory for inputting the clock sck, commands csb, rasb, casb, web, address adr and input data din, and outputting the output data dout.

Figure 9:
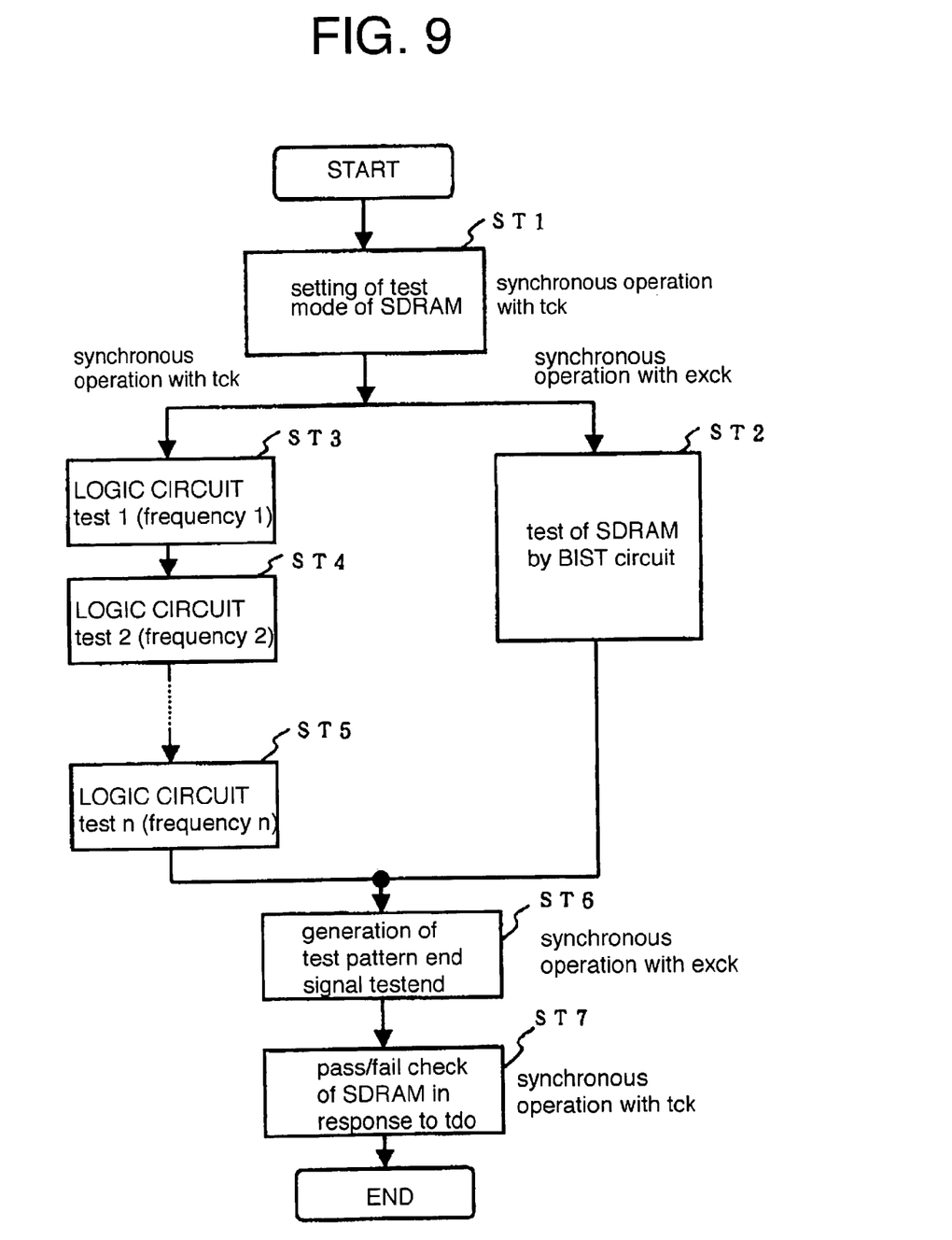
FIG. 9 is a flow chart showing a method of testing the system LSI 100 in FIG. 8.

FIG. 9 is a flow chart showing a method of testing the system LSI 100 in FIG. 8.

When a test is started and the test clock tck, test mode signal tms and test data input signal tdi are supplied from the tester 35 to the system LSI 100 in step ST1, data for deciding a test mode such as a test pattern, a method of scanning an address and the like in response to the test mode signal tms and test data input signal tdi in synchronization with the test clock tck are inputted to the BIST circuit 40A, thereby activating the BIST circuit 40A.

In step ST2, according to the test mode in step S1, the activated BIST circuit 40A generate the clock sck, commands csb, rasb, casb, web, and address adr for supplying to the SDRAM 20 in synchronization with the external clock exck supplied from the oscillator 111, thereby testing the SDRAM 20. The BIST circuit 40A does not depend on the test clock tck during a test period in step ST2.

The test signal ts is supplied from the tester 35 to the logic circuit 112 in steps ST3 to ST5 in parallel with the step ST2, and a test of variety of frequencies of the logic circuit 112 is tested using the test clock tck.

In step ST7, the test pattern end signal testend representing the end of test of the SDRAM 20 is outputted from the BIST circuit 40A in synchronization with the external clock exck.

In step ST7, the tester 35 effects pass/fail judgment of the SDRAM 20 in response to the test data output signal tdo in synchronization with the test clock tck upon reception of the test pattern end signal testend, and end the test.

The third embodiment has the following effects.

Since the oscillator 111 for generating the external clock exck which is different group of the test clock tck is provided in the control chip 110, the SDRAM 20 and logic circuit 112 can be independently controlled. Accordingly, the SDRAM 20 and logic circuit 112 can be tested parallelly. It is possible to supply a specific frequency to the SDRAM 20 and to supply various frequencies to the logic circuit 112 during the parallel test. Accordingly, it is expected to shorten a test time significantly.

Since it is structured that the test pattern end signal testend can be outputted from the control chip 110, a complex control can be easily made by the tester 35 during the parallel test.

Figure 10:
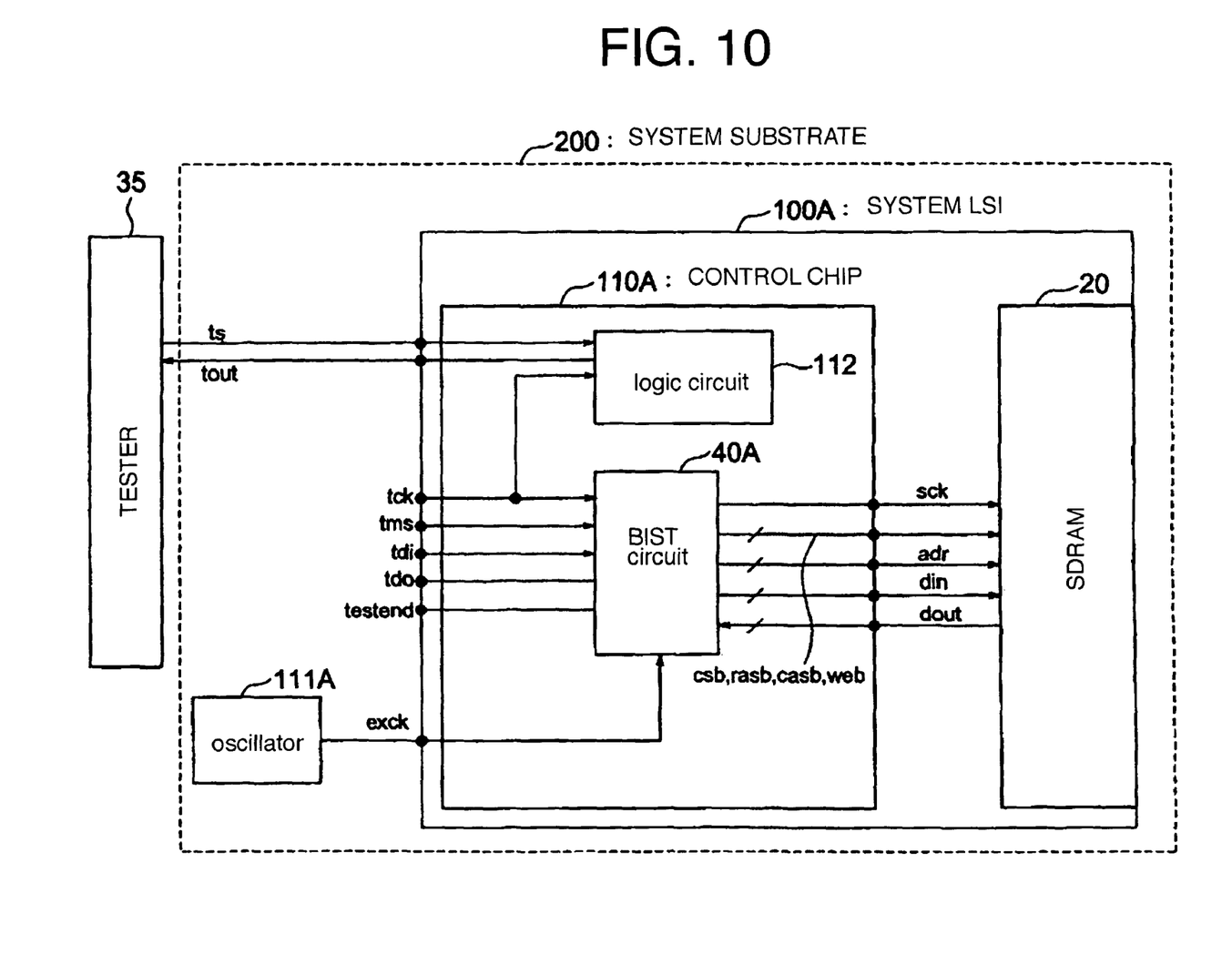
FIG. 10 is a circuit diagram showing a system substrate according to a fourth embodiment of the invention.

FIG. 10 is a schematic circuit diagram showing an example of a structure of a semiconductor integrated circuit (e.g., system substrate) showing a fourth embodiment of the invention on which the BIST circuit 40A of the second embodiment shown in FIG. 5 is mounted. In FIG. 10, components which are common to those of the third embodiment shown in FIG. 8 are depicted by the common reference numerals.

A system substrate 200 comprises a system LSI 100A and clock generation means (e.g., oscillator such as a crystal oscillator) 111A for generating an external clock exck, which are mounted on the same substrate.

The system LSI 100A comprises a control chip 110A and the SDRAM 20 shown in FIG. 5 which are housed in the same package. The control chip 110A comprises the BIST circuit 40A shown in FIG. 5 and a logic circuit 112 which are formed on the same semiconductor integrated circuit. The BIST circuit 40A is a circuit for inputting at a given timing a test clock tck, a test mode signal tms, a test data input signal tdi, the external clock exck supplied from the oscillator 111A and a output data dout of the SDRAM 20 which are supplied from a tester 35, and outputting at a given timing a test data output signal tdo, a test pattern end signal testend, input signals (a clock sck, commands csb, rasb, casb, web, address adr and an input data din) of the SDRAM 20. The logic circuit 112 is a circuit for inputting the test clock tck and a test signal ts which are supplied from the tester 35, and outputting a result of test tout to the tester 35 after the end of the test. The SDRAM 20 is a semiconductor memory for inputting the clock sck, commands csb, rasb, casb, web address adr and input data din, and outputting the output data dout.

According to the system substrate 200 shown in FIG. 10, a test is effected in the same manner as the third embodiment shown in FIG. 9.

The fourth embodiment has the following effect in addition to the effect of the third embodiment.

Since the oscillator 111A is provided outside the system LSI 100A, a chip area of the system LSI 100A can be reduced.

The invention is not limited to the first to fourth embodiments set forth above, but various modifications and utilization manner can be effected. As the modifications and utilization manner are exampled as follows.

In FIG. 2 and FIG. 6, the output control circuit 80 serving as the output means can be omitted, and the data latch circuit 74 may be provided with such an output function. In this case, the data latch circuit 74 serving as the output means may be structured such that it latches the result of comparison s73 of "H" of the EXOR 73, and outputs "H" as the test data output signal tdo in synchronization with the test clock tck. As a result, the circuit arrangement is simplified.

In FIG. 8, other clock generation means such as a PLL circuit and the like may be provided instead of the oscillator 111.

Although the SDRAM 20 is used as the circuit to be tested, the invention can be applied to various circuits to be tested such as other semiconductor memories such as an SRAM, a flash ROM, a mask ROM and the like, or semiconductor integrated circuits such as a logic circuit and the like.

What is claimed is:

1. A test circuit comprising:
   an input circuit inputting data to select a test mode relative to a circuit to be tested and outputting result of selection of the test mode in synchronization with a first clock;
   a pattern generation circuit, responding to result of selection of the test mode, generating a test pattern in synchronization with a second clock and outputting the test pattern to a circuit to be tested;
   a comparator inputting result of test of the circuit to be tested in synchronization with the second clock, and comparing coincidence/non-coincidence between the result of the test and the test pattern supplied to the circuit to be tested; and
   an output circuit holding result of comparison by the comparator and outputting the result of comparison in synchronization with the first clock.

2. The test circuit according to claim 1 wherein
   the comparator compares the result of test and the test pattern so as to detect a defect part of the circuit to be tested; and
   the output circuit holds result of detection by the comparator and outputs the result of detection in synchronization with the first clock.

3. A test circuit comprising:
   an input circuit inputting data to select a test mode relative to a circuit to be tested and outputting result of selection of the test mode in synchronization with a first clock;
   a pattern generator responding to result of selection of the test mode, generating a test pattern in synchronization with a second clock and outputting the test pattern to a circuit to be tested, and outputting a test pattern end signal representing end of generation of the test pattern;
   a comparator inputting result of test of the circuit to be tested in synchronization with the second clock, and comparing coincidence/non-coincidence between the result of the test and the test pattern supplied to the circuit to be tested; and
   an output circuit holding result of comparison by the comparator and outputting the result of comparison in synchronization with the first clock.

4. The test circuit according to claim 3, wherein
   the comparator compares the result of test and the test pattern so as to detect a defect part of the circuit to be tested; and
   the output circuit holds result of detection by the comparator and outputs the result of detection in synchronization with the first clock.

5. A semiconductor memory comprising:
   an input circuit inputting data to select a test mode relative to a circuit to be tested and outputting result of selection of the test mode in synchronization with a first clock;
   a pattern generation circuit, responding to result of selection of the test mode, generating a test pattern in synchronization with a second clock and outputting the test pattern to a circuit to be tested;
   a comparator inputting result of test of the circuit to be tested in synchronization with the second clock, and comparing coincidence/non-coincidence between the result of the test and the test pattern supplied to the circuit to be tested;
   an output circuit holding result of comparison by the comparator and outputting the result of comparison in synchronization with the first clock
   a logic circuit for executing a logical operation in synchronization with the first clock being formed on the same semiconductor memory; and
   a clock generator generating the second clock so as to supply the second clock to the test circuit being provided inside or an outside of the semiconductor memory.

* * * * *